United States Patent [19]

Upadhyayula

[11] Patent Number: 4,682,055
[45] Date of Patent: Jul. 21, 1987

[54] CFET INVERTER HAVING EQUAL OUTPUT SIGNAL RISE AND FALL TIMES BY ADJUSTMENT OF THE PULL-UP AND PULL-DOWN TRANSCONDUCTANCES

[75] Inventor: Lakshminarasimha C. Upadhyayula, East Windsor Township, Mercer County, N.J.

[73] Assignee: RCA Corporation, Princeton, N.J.

[21] Appl. No.: 839,917

[22] Filed: Mar. 17, 1986

[51] Int. Cl.[4] .......................................... H03K 17/687
[52] U.S. Cl. .................................... 307/451; 307/443; 307/450; 307/585; 307/263; 357/42
[58] Field of Search ............ 307/200 B, 443, 450–452, 307/481, 576, 579, 585, 263, 303; 352/42

[56] References Cited

U.S. PATENT DOCUMENTS

| 3,651,340 | 3/1972 | Cliff | 307/251 |
|---|---|---|---|
| 4,103,188 | 7/1978 | Morton | 307/570 |
| 4,400,636 | 8/1983 | Andrade | 307/446 |
| 4,405,870 | 12/1980 | Eden | 307/446 |
| 4,418,292 | 5/1980 | Cserhalmi | 307/443 |

OTHER PUBLICATIONS

RCA COS/MOS Integrated Circuits Manual, RCA Solid State Division, Somerville, N.J., 1971, pp. 24–25.
Yang, Fundamentals of Semiconductor Devices, McGraw-Hill Book Co., New York, 1978, pp. 199–206.
"p-Channel (Al,Ga) As/GaAs Modulation-Doped Logic Gates", R. A. Kiehl et al., IEEE Electron Device Letters, vol. EDL-5, No. 10, Oct. 1984, pp. 420–422.

Primary Examiner—Stanley D. Miller
Assistant Examiner—D. R. Hudspeth
Attorney, Agent, or Firm—Joseph S. Tripoli; Fred Jacob; Henry I. Steckler

[57] ABSTRACT

A circuit comprises P-channel and N-channel field effect transistors. A conduction electrode, such as a drain, of one of the transistors is coupled to a conduction electrode of the other transistor. Means are provided for ensuring that the currents in the transistors when changing state, and hence the rise and fall times of an output signal of the transistors, are substantially equal. Preferably, the ensuring means comprises the channel length of the P-channel transistor being smaller than that of the N-channel device. Alternately, either the doping level or the width of the P-channel device can be greater than that of the N-channel device.

5 Claims, 7 Drawing Figures

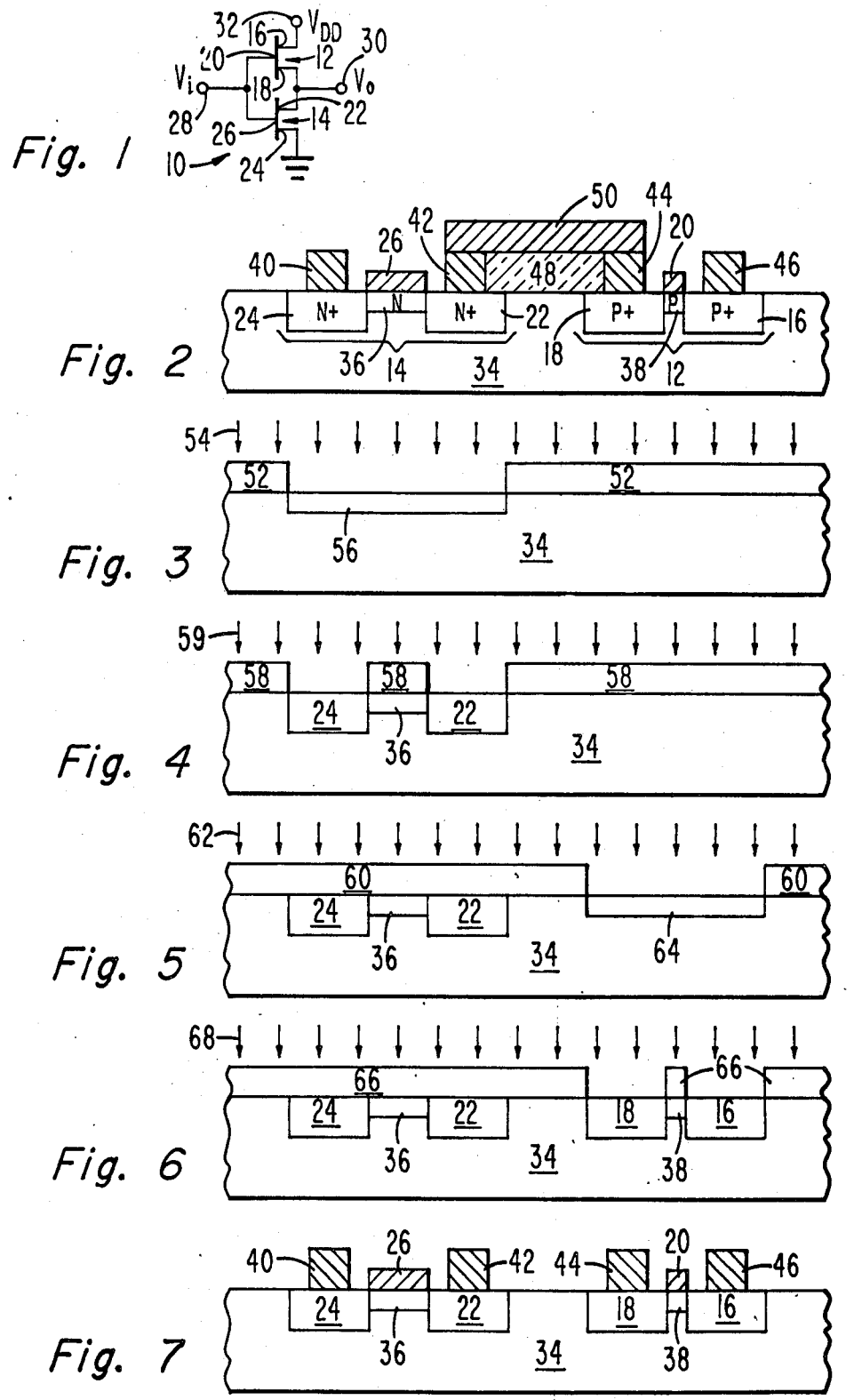

CFET INVERTER HAVING EQUAL OUTPUT SIGNAL RISE AND FALL TIMES BY ADJUSTMENT OF THE PULL-UP AND PULL-DOWN TRANSCONDUCTANCES

BACKGROUND OF THE INVENTION

The present invention relates to a pair of complementary conductivity type transistors, and more particularly to such a pair that have about equal currents when changing logic states.

There is interest in using GaAs metal semiconductor field effect transistors (MESFETs) in logic circuits due to their higher speed and radiation resistance as compared to silicon (Si) FETs.

A typical logic gate has a depletion or enhancement mode (normally ON and OFF, respectively) driver FET and a load, such as a resistor or a depletion mode FET, coupled thereto. However, such a circuit consumes power when in the quiescent (non-switching) state. This limits the gate packing density when many such gates are formed in an integrated circuit (IC) due to heat dissipation limitations of the IC. It has been suggested in the article "p-Channel (AL,Ga) As/GaAs Modulation-Doped Logic Gates", by R. A. Kiehl et al., IEEE Electron Device Letters, Vol. EDL-5, No. 10, Oct. 1984, pp. 420–422, to use complementary conductivity type MESFETs in a logic gate so that the gate draws current only when changing states, and therefore consumes only a small amount of power. Thus a high packing density can be achieved. However, in such a circuit, the currents in the P-channel and N-channel FETs are not equal due to the difference in mobility of holes and electrons. This results in different values for the rise and fall times of an output logic pulse, especially when the output of the logic gate drives a capacitive load, such as another FET logic gate. In turn, a timing error in logic signals occurs, which can cause erroneous logic signals.

It is therefore desirable to provide a circuit that has low power requirements in order to achieve a high packing density and substantially equal, preferably as equal as possible, currents in complementary conductivity type transistors when changing states to avoid erroneous logic signals.

SUMMARY OF THE INVENTION

A circuit comprises a P-channel field effect transistor having a pair of conduction electrodes; an N-channel field effect transistor having a pair of conduction electrodes, one of the P-channel transistor conduction electrodes being coupled to one of the N-channel transistor conduction electrodes; and means for ensuring substantially equal currents in said transistors when changing the logic state.

BRIEF DESCRIPTION OF THE DRAWING

FIG. 1 is a schematic diagram of a logic gate circuit using MESFETs;

FIG. 2 is a cross-section of an IC having the circuit of FIG. 1; and

FIGS. 3–7 are cross-sections that show successive manufacturing steps to produce the IC of FIG. 2.

DETAILED DESCRIPTION OF THE PREFERRED EMBODIMENTS

FIG. 1 shows a logic inverter gate 10 having complementary conductivity type, i.e. P-channel and N-channel enhancement mode MESFETs 12 and 14, respectively. The MESFET 12 comprises a pair of conduction electrodes, i.e. a source 16 and a drain 18, and a control electrode, i.e. a gate 20; similarly, the MESFET 14 comprises a pair of conduction electrodes, i.e. a drain 22 and a source 24, and a control electrode, i.e. a gate 26. The gates 20 and 26 are coupled together and to an input terminal 28 that receives an input voltage $V_i$. The drains 18 and 22 are coupled together and to an output terminal 30 to provide an output voltage $V_o$. The source 16 is coupled to a supply terminal 32 to receive the positive voltage, $V_{DD}$, while the source 24 is coupled to a reference voltage, such as ground. The gate 20 to source 16 threshold voltage for the MESFET 12 to be ON (conduct) is less than zero volts, while the gate 26 to source 24 threshold voltage for the MESFET 14 to conduct is greater than zero volts.

In operation, when $V_i$ is zero volts, the gate-to-source voltage of the MESFET 14 is zero so that it is OFF, while the gate-to-source voltage of the MESFET 12 is $-V_{DD}$ so it is ON. Thus $V_o$ is about $V_{DD}$. When the input voltage is $+V_{DD}$, the gate-to-source voltage of the MESFET 14 is $+V_{DD}$ so that it is ON, while the gate-to-source voltage of the MESFET 12 is zero so that it is OFF. Thus $V_o$ is about zero.

Since in the quiescent state one of the MESFETs 12 and 14 is OFF, no current is drawn from the terminal 32; only when the logic gate 10 changes states is current drawn. This greatly reduces the power consumed, and therefore allows a high packing density. Making the logic signal voltage level equal to $V_{DD}$, provides a high noise immunity.

It will be appreciated, that as known in the art, two logic inverter gates 10 can be cross-coupled to form a flip-flop type memory storage element.

FIG. 2 shows a substrate 34 having the MESFETs 12 and 14 disposed near the surface thereof. The source 24 and the drain 22 are of $N^+$-conductivity type, while an N-conductivity type channel region 36 lies therebetween. The source 16 and the drain 18 are of $P^+$-conductivity type, while a P-conductivity type channel region 38 lies therebetween. In accordance with a preferred embodiment of the invention and as shown in FIG. 2, the length (distance between the source and the drain) of the channel region 38 is less than that of the channel region 36 (explained in detail below). Ohmic contacts 40, 42, 44, and 46 overlie the source 24, the drains 22 and 18, and the source 16, respectively. The contacts 40 and 46 couple the sources 24 and 16, respectively, to ground and the terminal 32, respectively, as shown in FIG. 1. The gates 26 and 20 are of the Schottky barrier type and overlie the channel regions 36 and 38, respectively, and are coupled together as shown in FIG. 1. An insulating layer 48 is disposed between the ohmic contacts 42 and 44. A conducting layer 50 overlies the contacts 42 and 44 and the insulating layer 48 to couple the drains 22 and 18 together and to the terminal 30 as shown in FIG. 1.

The substrate 34 preferably comprises a semi-insulating material, such as GaAs, for high speed and high radiation resistance. Alternately, the substrate 34 can comprise Si or Si-on-sapphire. To form Schottky barrier gates, the gate 26 can comprise successive layers of Ti, Pt, and Au, while the gate 20 can comprise successive layers of Pt, Ag, and Au. To increase the barrier height, a 1 to 5 nanometers thick layer of $SiO_2$ can be interposed between the channels 36 and 38 and the gates 26 and 20, respectively. Due to the thinness of this layer, the gates 20 and 26 still function as Schottky barrier gates. Each of the ohmic contacts 40 and 42 for the N-channel MESFET 14 preferably comprises a compound structure having a Au/Ge alloy bottom layer, an Ni intermediate layer, and an Au top layer, while the ohmic contacts 44 and 46 for the P-channel MESFET 12 preferably comprises a Ti bottom layer, a Pt intermediate layer, and a Au top layer. The insulating layer 48 can comprise $SiO_2$ or $Si_3N_4$, while the conducting layer 50 can comprise separate layers of Ti and Au. A typical value for $V_{DD}$ is 0.6 to 1 volt.

FIG. 3 shows the first manufacturing steps, wherein a photoresist 52 is deposited and defined on the substrate 34. As indicated by the arrows 54, N-conductivity type doping is done by $Si^+$ ions that are implanted into a region 56 at 35 kiloelectron volts (KeV) using an areal dosage of $6.5 \times 10^{11}$ ions/cm$^2$. Thereafter, the photoresist 52 is removed and photoresist 58 of FIG. 4 deposited and defined. The arrows 59 show an $Si^+$ ion implantation at 50 KeV with an areal dosage of $2 \times 10^{13}$ ions/cm$^2$ to form the $Nd^+$-conductivity type drain and source regions 22 and 24. The remaining portion of the region 56 of FIG. 3 forms the channel region 36 shown in FIG. 4.

Similarly, after the photoresist 58 is removed and photoresist 60 of FIG. 5 deposited and defined, P-conductivity type doping as shown by the arrows 62 is done by using $Be^+$ ions at 15 KeV with an areal dosage of $1.1 \times 10^{12}$ ions/cm$^2$ to form the region 64. Thereafter the photoresist 60 is removed and photoresist 66 of FIG. 6 deposited and defined. $P^+$-conductivity type doping as indicated by arrows 68 is done using $Be^+$ ions at 20 KeV using an areal dosage of $2.5 \times 10^{13}$ ions/cm$^2$ to form the drain and source regions 18 and 16; the remaining portion of the region 64 of FIG. 5 forms the channel region 38 shown in FIG. 6.

As known in the art, all ion implants are activated by annealing. Because of the small dimensions involved herein, typically about 1 $\mu$m for the length of the gate 36, "flash" (about 4 sec. duration) annealing from a sun gun lamp is used rather than longer duration thermal annealing.

Thereafter, as shown in FIG. 7, the gate 26 is deposited and defined using a lift-off photoresist (not shown). Then the ohmic contacts 40 and 42 are deposited and defined again using a lift-off photoresist (not shown). Similarly, the gate 20 is then deposited and defined; and then the ohmic contacts 44 and 46 are deposited and defined. Thereafter, the insulating layer 48 of FIG. 2 is deposited and defined, and then conducting layer 50 of FIG. 2.

It has been found that by making the length of the channel region 38 less than that of the channel region 36, the currents of the MESFETs 12 and 14 when the gate 10 is changing states can be made substantially equal, preferably as equal as manufacturing tolerances allow. In turn, this makes the rise and fall times and propagation delay of the logic inverter gate 10 smaller by about 25 to 40 percent than that of a depletion load type inverter having the length for the channel region 36. Preferably, the length of the channel 38 is about 0.1 to 0.5 of the length of the channel region 36 for a typical $V_{DD}$ of from 0.5 to 1 volt in order to equalize the currents. For this embodiment the currents comprise the saturation currents in the MESFETs when fully ON as the electric fields correspond to the saturation values in each FET. The total input capacitance at the coupled gates 20 and 26 is equal to about 1.1 to 1.5 times that of gate 26 alone.

Alternately, about equal currents can be achieved by having the doping level of the channel region 38 greater than, typically about 5 times greater, that of the channel region 36 with everything else, including the channel lengths thereof, being equal. However, this makes the total input capacitance about 3.24 times greater than that at the gate 26 alone.

Yet another alternate embodiment for equalizing the currents, is to make the width of the channel region 38 greater, typically about five times greater, than the width of the channel region 36, everything else being equal. By "width" is meant the direction perpendicular to both the channel length and the plane of FIG. 2. This makes said total input capacitance about six times that of gate 26 alone.

It will therefore be readily appreciated that the preferred embodiment is that of making the length of the channel region 38 less than that of the channel region 36, since this embodiment has the smallest input capacitance, which is also essentially the load capacitance when the gate 10 drives a single identical gate, thus resulting in the fastest rise and fall time, and smallest progation delay.

It will be appreciated that the present invention can also be used with junction gate FETs. Up until now, GaAs metal oxide semiconductor FETs have not proven feasible; however, the invention can be used with Si or Si-on-sapphire substrate MOSFETs.

What is claimed is:

1. A logic circuit comprising:
input, output, and a pair of power supply terminals having a potential difference therebetween of between about 0.5 and 1 volt;
a P-channel metal semiconductor field effect transistor having gate, source, and drain electrodes; and
an N-channel metal semiconductor field effect transistor having gate, source, and drain electrodes, the P-channel transistor drain electrode being coupled to the N-channel transistor drain electrode and to said output terminal, said gate electrodes being coupled together and to said input terminal, said source electrodes being respectively coupled to said power supply terminals; wherein
the length of said P-channel transistor channel region is between about 0.1 and 0.5 $\mu$m, to ensure substantially equal currents in said transistors when changing the logic state.

2. A logic circuit comprising:
input, output and a pair of power supply terminals;
a P-channel field effect transistor having gate, source and drain electrodes; and
an N-channel field effect transistor having gate, source, and drain electrodes, the P-channel transistor drain electrode being coupled to the N-channel transistor drain electrode and to said output terminal, said gate electrodes being coupled together and to said input terminal, said source electrodes being respectively coupled to said power supply terminals; wherein
the doping level of the channel region of said P-channel transistor is about five times the doping level of the channel region of said N-channel transistor, thereby ensuring substantially equal currents in said transistors when changing the logic state.

3. The circuit of claim 2, wherein each of said transistors comprises a metal semiconductor field effect transistor.

4. A logic circuit comprising:
input, output, and a pair of power supply terminals;
a P-channel field effect transistor having gate, source, and drain electrodes; and
an N-channel field effect transistor having gate, source and drain electrodes, the P-channel transistor drain electrode being coupled to the N-channel transistor drain electrode and to said output terminal, said gate electrodes being coupled together and to said input terminal, said source electrodes being respectively coupled to said power supply terminals; wherein
the width of the channel region of said P-channel transistor is about five times that of the width of the channel region of said N-channel transistor, thereby ensuring substantially equal currents in said transistors when changing the logic state.

5. The circuit of claim 4, wherein each of said transistors comprises a metal field effect transistor.

* * * * *